US010551659B2

(12) United States Patent
Liu

(10) Patent No.: US 10,551,659 B2
(45) Date of Patent: Feb. 4, 2020

(54) TOUCH SENSING APPARATUS WITH DUAL TOUCH SENSORS

(71) Applicant: TEXAS INSTRUMENTS INCORPORATED, Dallas, TX (US)

(72) Inventor: Dongtai Liu, Fremont, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/708,120

(22) Filed: Sep. 18, 2017

(65) Prior Publication Data

US 2018/0081221 A1 Mar. 22, 2018

Related U.S. Application Data

(60) Provisional application No. 62/395,489, filed on Sep. 16, 2016.

(51) Int. Cl.
*G06F 3/041* (2006.01)
*G02F 1/1333* (2006.01)
*G06F 1/16* (2006.01)

(52) U.S. Cl.
CPC ........ *G02F 1/13338* (2013.01); *G06F 1/1692* (2013.01); *G06F 3/0412* (2013.01); *G06F 2203/04103* (2013.01)

(58) Field of Classification Search
CPC .... G06F 3/0412; G06F 3/0414; G06F 3/0416; G06F 3/044; G06F 3/0362; G06F 2203/0339; G06F 2203/04103
See application file for complete search history.

(56) References Cited

U.S. PATENT DOCUMENTS

| 7,728,819 | B2* | 6/2010 | Inokawa | G06F 3/016 |
| | | | | 178/18.05 |
| 8,441,460 | B2* | 5/2013 | Chang | G06F 1/1626 |
| | | | | 345/172 |
| 9,354,724 | B2* | 5/2016 | Huguenard | G06F 3/03545 |
| 2007/0146334 | A1* | 6/2007 | Inokawa | G06F 3/016 |
| | | | | 345/173 |

* cited by examiner

*Primary Examiner* — Vijay Shankar
(74) *Attorney, Agent, or Firm* — John R. Pessetto; Charles A. Brill; Frank D. Cimino

(57) ABSTRACT

A touch sensing apparatus for dual (adjacent) touch buttons (areas) defined on a touch surface (such as a sidewall of a mobile communications device). The apparatus includes first and second touch sensor assemblies, each including a support structure, a mounting structure to mount the touch sensor assembly to the back-side of the surface, and a sense inductor coil disposed on one of the support structure and the mounting structure. The first touch sensor assembly mounted to the back-side of the surface opposite the first touch area. The second touch sensor assembly mounted to the back-side of the surface opposite the second touch area. The touch sensor assembly can be constructed with the sense inductor coil disposed on the support structure, such that deflection of the respective touch area causes the touch surface to deflect toward the sense inductor coil, or with the sense inductor coil is disposed on the mounting structure, such that deflection of the respective touch area causes the touch surface and the sense coil inductor to deflect toward the support structure.

19 Claims, 8 Drawing Sheets

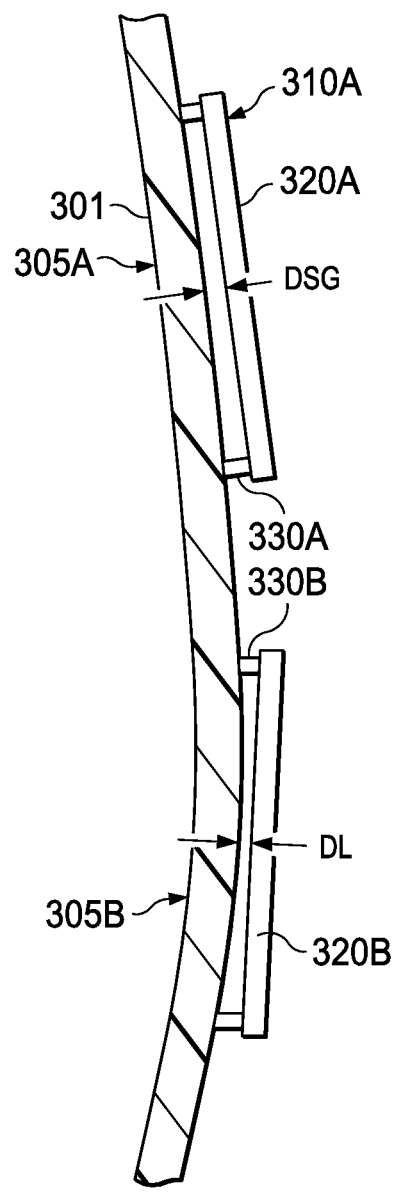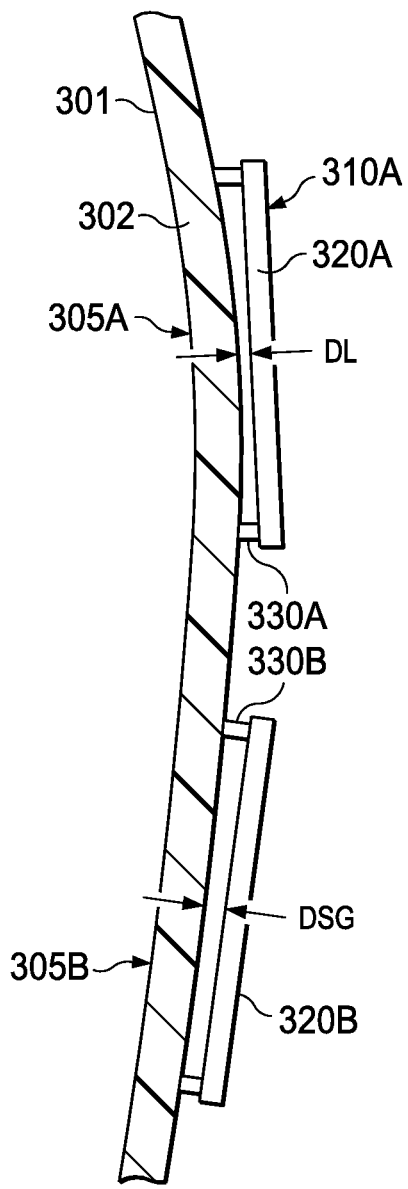
FIG. 3B                                    FIG. 3C

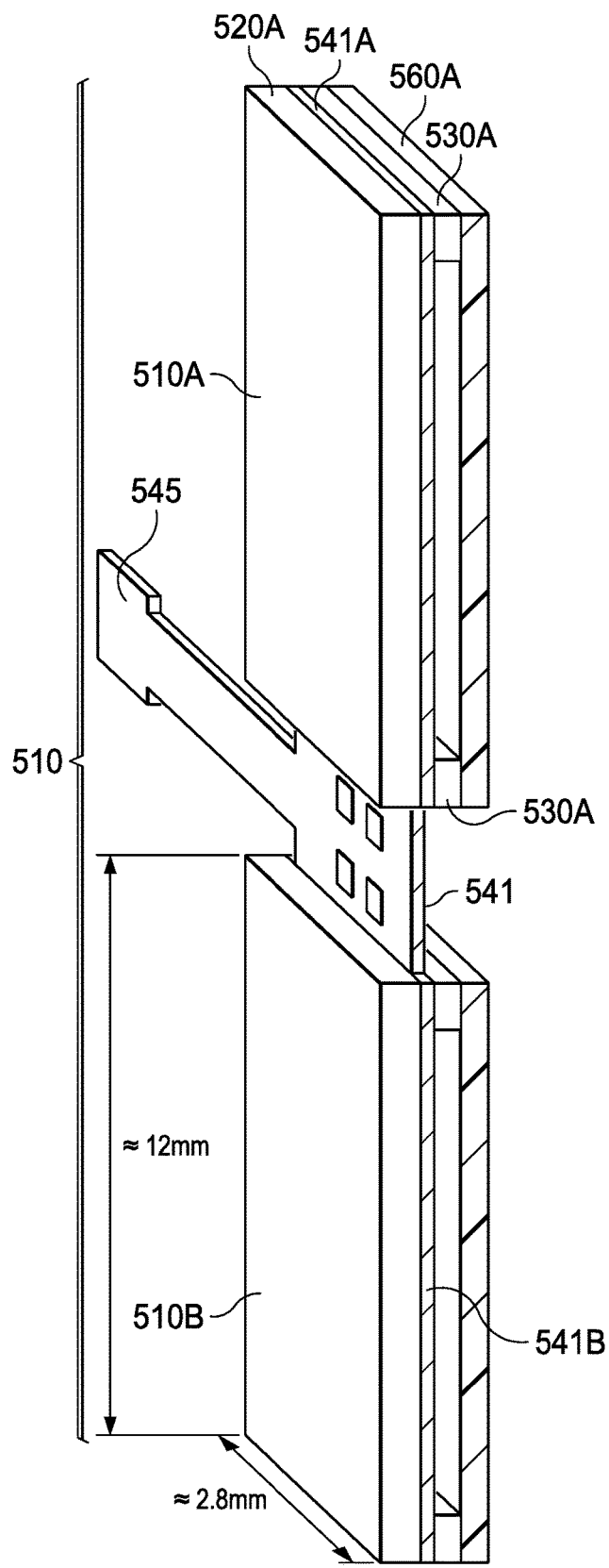
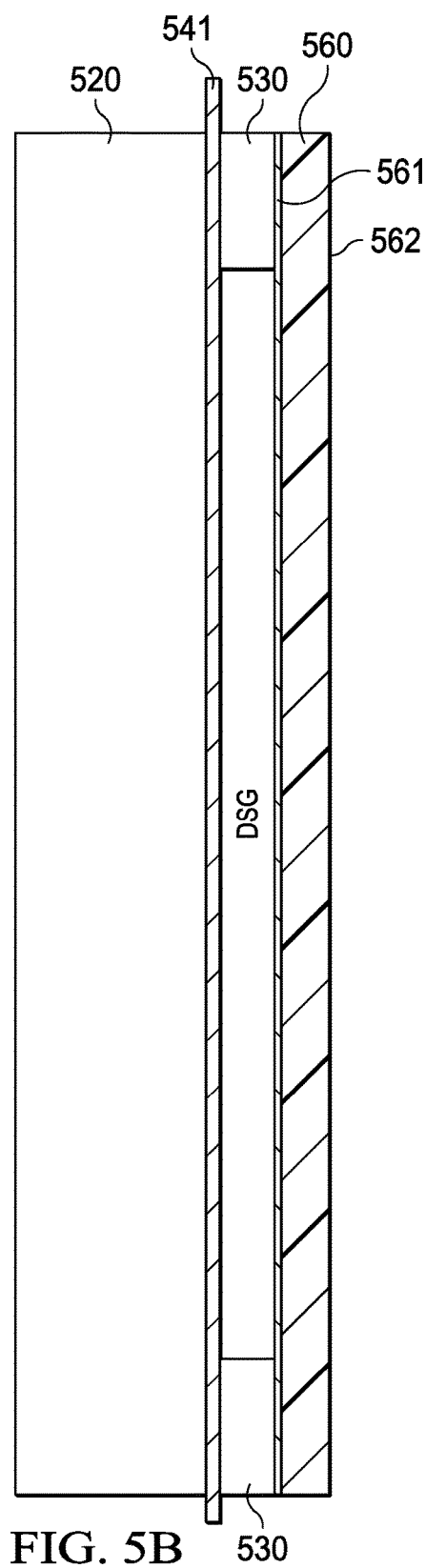
FIG. 5A
FIG. 5B

TOUCH SENSING APPARATUS WITH DUAL TOUCH SENSORS

CROSS-REFERENCE TO RELATED APPLICATIONS

Priority is claimed under 37 CFR 1.78 and 35 USC 119(e) to U.S. Provisional Application 62/395,489, filed 2016 Sep. 16), which is incorporated by reference.

BACKGROUND

Technical Field

This Patent Disclosure relates to touch sensing, such as touch input buttons/keys, such as for use in mobile/personal communications and computing devices.

Related Art

In mobile devices (and other equipment), touch sensing technology can be used to replace physical/mechanical buttons. Touch sensing, which can be based on capacitive and inductive sensing, can be used to detect touch-press touch button defined on a touch surface. Touch sensing can be used to detect both XY position on a touch surface (proximity), and Z-force, such as based on surface deflection/deformation.

Touch sensing technology can be can be used with different touch surfaces, including conductive (metal or conductive coated), and nonconductive (such as glass and plastic. Touch sensing to replace physical/mechanical buttons is distinguished from, for example, capacitive touch buttons defined on a device screen.

While this Background information references touch input for mobile/personal communication/computing devices, this Patent Disclosure is more generally directed to input button/keys based on touch technology.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for inductive touch sensing with back-side sensor mounting.

According to aspects of the Disclosure, a touch sensing apparatus for dual (adjacent) touch areas (such as touch buttons) defined on a touch surface (such as a sidewall of a mobile communications device). The apparatus includes first and second touch sensor assemblies, each including a support structure, a mounting structure to mount the touch sensor assembly to the back-side of the surface, and a sense inductor coil disposed on one of the support structure and the mounting structure. The first touch sensor assembly is mounted to the back-side of the surface opposite the first touch area, and the second touch sensor assembly is mounted to the back-side of the surface opposite the second touch area.

Other aspects and features of the invention claimed in this Patent Document will be apparent to those skilled in the art from the following Disclosure.

BRIEF DESCRIPTION OF THE DRAWINGS

FIGS. 3A-3C illustrate, for dual touch buttons [305A/305B] local deformation [$D_L$] of a touch-pressed button in comparison to the other button which remains substantially at a defined sensing-gap [$D_S$].

FIGS. 5A-5B illustrate an example dual touch sensor assembly [510, 510A/510B], with a flex PCB [541] including separate sense coil PCB sections [541A/541B] with a center trace connector [545], each touch sensor assembly [FIG. 5B] including a flex sense coil PCB [541] mounted to a stiffener [520] with spacer elements [530] adhered to an epoxy laminate [560] with a copper laminate [561] spaced from the sense coil by a defined sensing gag [$D_S$].

DETAILED DESCRIPTION

This Description and the Drawings constitute a Disclosure for touch sensing apparatus for dual touch buttons with back-side inductive sensor mounting, including describing design examples (example implementations), and illustrating various technical features and advantages.

Example embodiments of the touch sensing apparatus for dual touch buttons are described in connection with an example application of a mobile communication device, in which dual touch buttons (such as volume up/dn) are defined on a sidewall of the device case.

In brief overview, in example embodiments, a touch sensing apparatus for dual (adjacent) touch buttons (areas) defined on a touch surface (such as a sidewall of a mobile communications device). The apparatus includes first and second touch sensor assemblies, each including a support structure, a mounting structure to mount the touch sensor assembly to the back-side of the surface, and a sense inductor coil disposed on one of the support structure and the mounting structure. The first touch sensor assembly can be mounted to the back-side of the surface opposite the first touch area, and the second touch sensor assembly can be mounted to the back-side of the surface opposite the second touch area. The touch sensor assembly can be constructed with the sense inductor coil disposed on the support structure, such that deflection of the respective touch area causes the touch surface to deflect toward the sense inductor coil, or with the sense inductor coil is disposed on the mounting structure, such that deflection of the respective touch area causes the touch surface and the sense coil inductor to deflect toward the support structure.

FIGS. 1A-1C and 3A-3C illustrate an example touch sensing apparatus for dual touch buttons, with back-side inductive sensor mounting, enabling touch-press sensing based on local touch button deformation, according to aspects of the invention. FIG. 2 illustrates an example implementation for a dual touch button (volume up/dn) arrangement in a sidewall of a device case. FIGS. 4A-4B illustrate an example touch sensing system with (dual) inductive touch sensors coupled to sensor electronics implemented as an inductance-to-data converter (IDC). FIGS. 5A-5B and 6A-6C illustrate example implementations of an inductive touch sensing apparatus for dual touch buttons respectively configured for alternate example back-side mounting such as to the sidewall of a mobile communications device case, and using an example dual-sense-coil flex PCB implementation illustrated in FIG. 7.

Figure 1A:
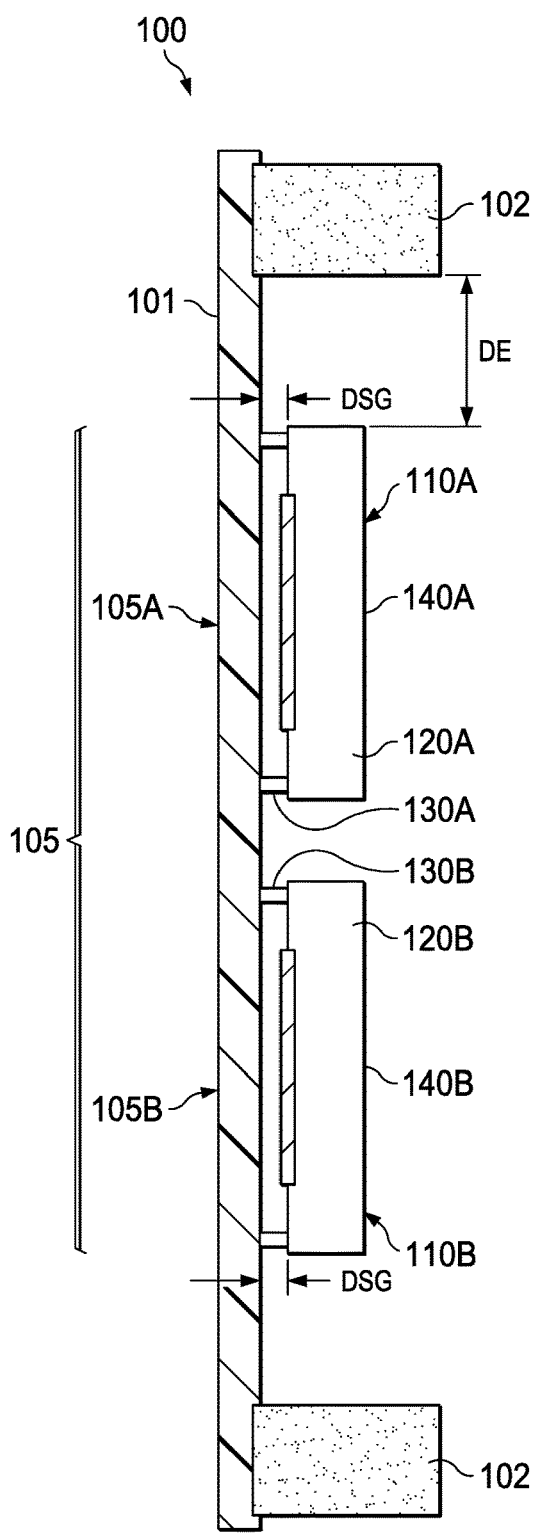
FIGS. 1A-1B illustrate an example touch sensing apparatus [100] for dual touch buttons [105, 105A/105B], with back-side inductive sensor mounting to a touch surface [101], with separate inductive touch sensor assemblies [110A/110B] back-side mounted to the touch surface with a defined sensing-gap [$D_S$], with FIGS. 1A-1C illustrating back-side mounting respectively with spacer elements [130A/130B], a snap-in structure [131/132], and copper vias [133/134].
Figure 2:
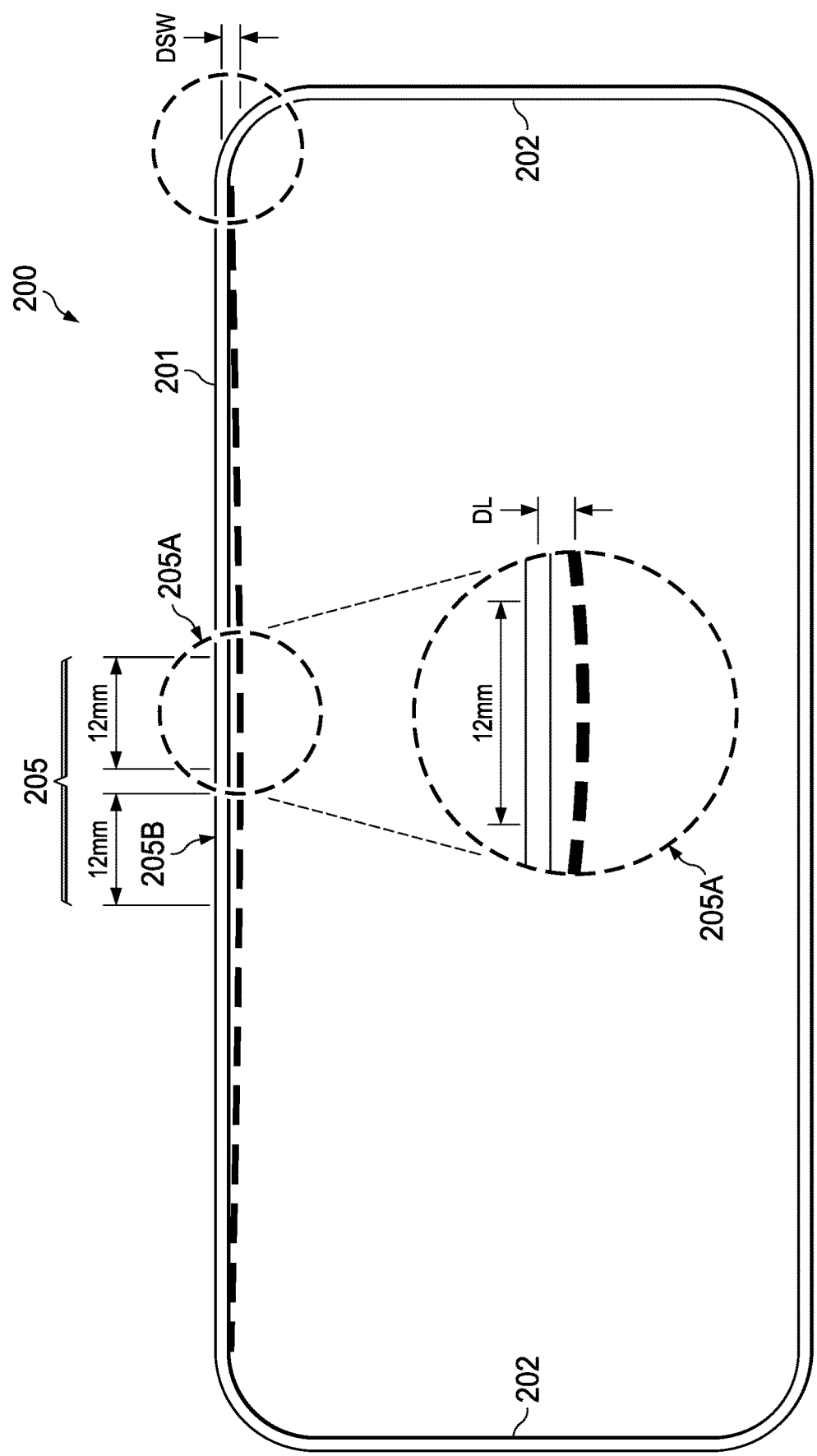
FIG. 2 illustrates an example mobile communications device case [200] including dual-touch buttons [205, 205A/205B] on a sidewall touch surface [201], and illustrating side-wall deflection [$D_{SW}$] of both touch buttons, in comparison to local deflection [$D_L$] of a touch-pressed button.

FIG. 1A illustrates an example touch sensing apparatus 100 for dual touch buttons 105, with adjacent touch buttons 105A and 105B, such as for volume up/dn touch buttons integrated into a mobile communications device case (as described in connection with FIG. 2). Touch sensing apparatus 100 for the dual touch buttons 105 include respective dual back-side inductive sensors 110A/110B mounted to the back side interior of a touch surface 101 (such as a sidewall of the device case) on which is define the dual touch buttons 105A/105B.

Each touch sensor 110A/110B includes a support structure represented by element 120A/120B, a mounting structure represented by spacers 130A/130B, and a sensor represented by inductive sense coil 140A/140B. Back-side mounting structure 130A/130B mounts the touch sensors 110A/110B to the back-side of the touch surface 101, with a defined sensing gap $D_{SG}$ between the touch surface 101 and the sense coil 140A/140B, with no supporting/mounting structure at the back-side of the touch sensors 110A/110B that would inhibit deflection/displacement in response to a touch-press.

Alternate example implementations of such a touch sensor are described in connection with FIGS. 5A-5B and FIGS. 6A-6C, which both use an example flex PCB (printed circuit board) with dual sensor sections as described in connection with FIG. 7.

According to aspects of the Disclosure, the mounting structure represented by spacers 130A/130B (a) mounts respective touch sensors 110A/110B to the back-side of touch surface 101, opposite respective touch buttons 105A/105B, providing the defined sensing gap $D_{SG}$, and (b) with a back-side mounting, permits local touch-press deformation of a touch button to reduce the localized distance between the touch surface 101 and the sense coil 140A/140B (i.e., to less than the defined sensing gap $D_{SG}$ by a predetermined threshold). In particular, the touch sensing apparatus 100 for dual touch buttons with back-side sensor mounting enable touch sensing of a touch button to be differentiated from non-localized deflection of the touch surface 101 that affects both adjacent touch buttons when one touch button is pressed.

FIG. 2 illustrates an example mobile communications device case 200 including dual-touch buttons 205 integrated into a sidewall 201 of the device case. A touch-press of one of the touch buttons 205A/205B will result in two deflection (deformation) mechanisms that can be differentiated by the touch sensing apparatus with back-side mounted touch sensors according to this Disclosure.

For example, a touch-press of touch button 205A will result in a local deflection $D_L$ of the touch button area 205A. In addition, the touch press will cause a deflection of the sidewall 201 that results in a non-localized deflection of the touch button area 205 that results in a non-localized displacement of both touch buttons 205A/205B. The non-localized displacement of sidewall 201 and touch buttons 205 is represented by the displacement (deflection) $D_{SW}$ of both touch buttons 205A/205B, in comparison to the local deflection $D_L$ of the touch-pressed button 205A, where $D_L$ is a predetermined threshold less than $D_{SG}$.

Touch press can be idealized by a string model where the sidewall 201 is simplified to a long string. When a touch-press Force is applied to a touch button 205A, the string becomes longer and a deflection corner is formed at the local point of the touch-press at touch button 205A. According to aspects of this Disclosure, the local deflection $D_L$ at the selected touch button 205A can be measured/detected as a button touch-press, while the non-localized displacement of the non-selected inductive button structure is not detected as a (false) button press (i.e., and displacement from the defined sensing gap $D_{SG}$ is substantially less than the defined threshold deflection $D_L$ for button-press detection.

Figure 3A:
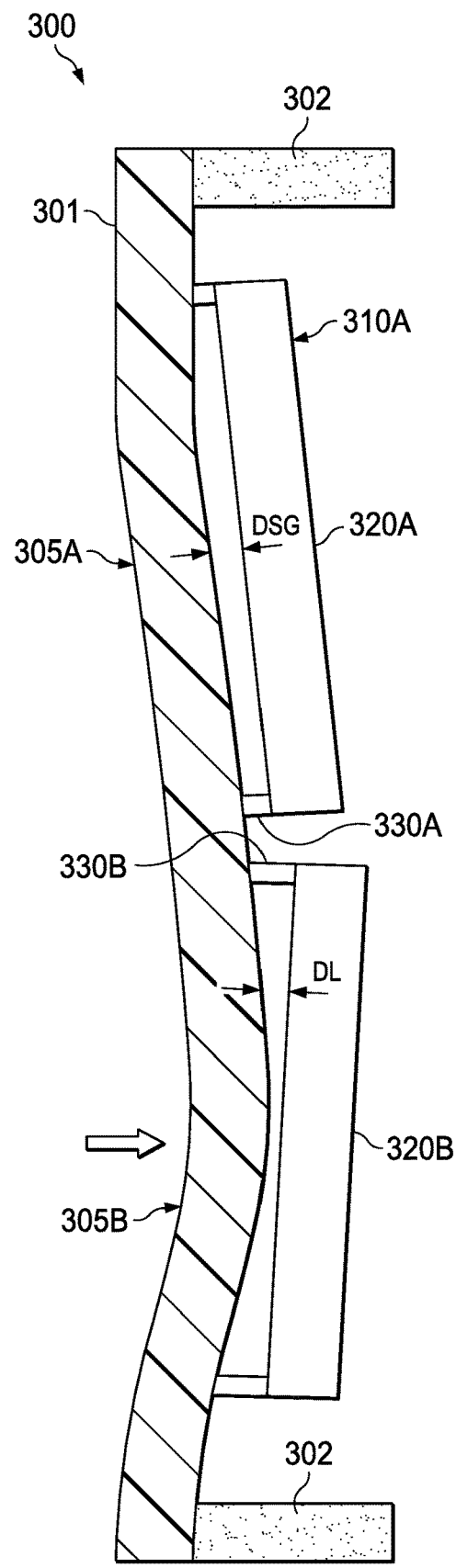
Figure 4A:
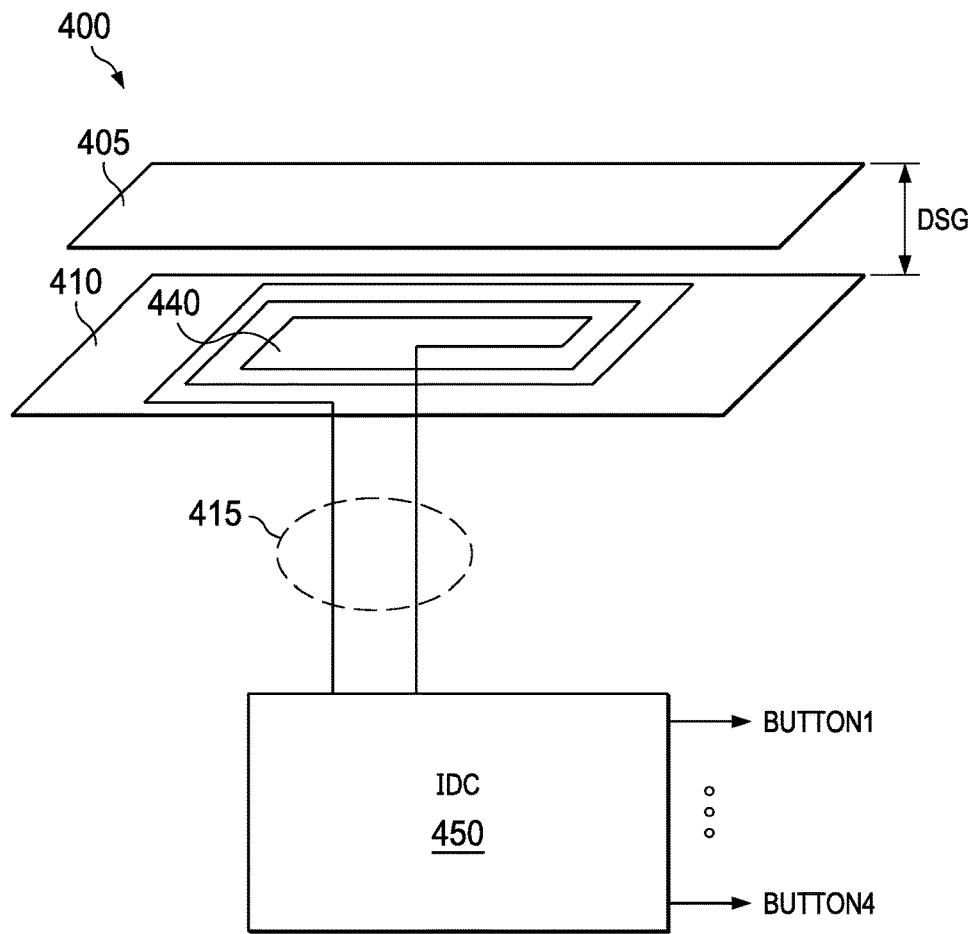
FIGS. 4A-4B illustrate an example touch sensing system [400] including a spaced [$D_S$] touch sensor assembly [410] including a sense inductor coil [440] coupled to an IDC [450] to sense touch-press conditions/events.
Figure 4B:
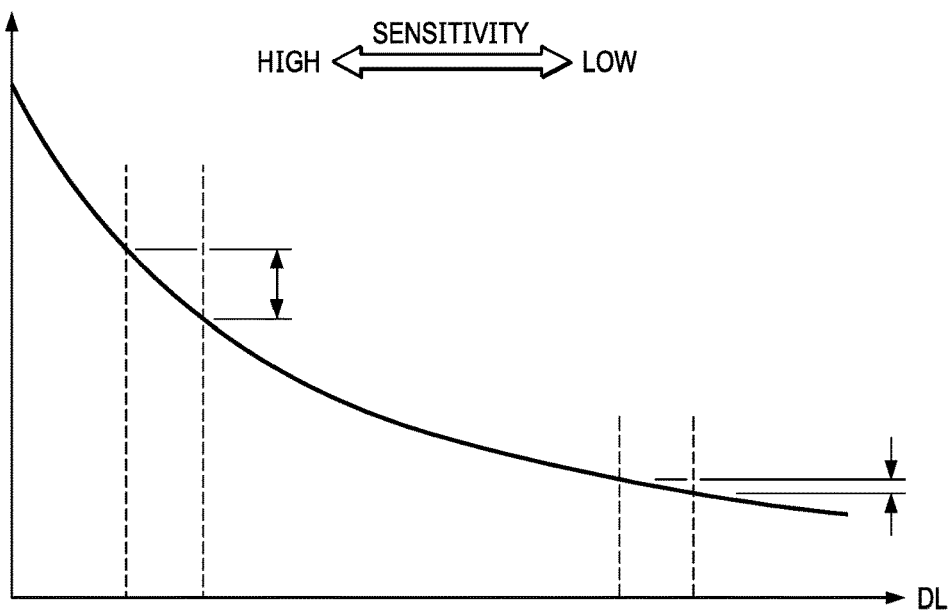

FIGS. 3A-3C illustrate example of touch sensing based on localized deformation of a touch button 305A/305B.

FIG. 3A illustrates an example touch sensing apparatus 300, including dual touch buttons 305A/305B. As illustrated, touch button 305A is touch-pressed resulting in a local deformation of touch surface 301 at touch button 305B, resulting in a local deformation that is represented by a deformation $D_L$, which is a pre-defined threshold less than the defined sensing gap $D_{SG}$.

As describe in connection with FIG. 2, a touch-press of touch button 305B will cause a general deflection of side wall 301 (FIG. 2, $D_{SW}$), including the adjacent touch button 305A. Because of back-side mounting of touch sensors 310A/310B, the local touch-press deflection of touch button 305B, causing a local deflection $D_L$, does not result in a corresponding local deflection of touch button 305A, and therefore does not cause a corresponding localized deflection of the touch button area 305A of sidewall 301, which remains substantially at the defined sensing-gap $D_S$ (i.e., with a separation between sidewall 301 and the sense coil 340A that is less than the local deflection $D_L$ by a predefined sensitivity).

FIGS. 3B and 3C illustrate a touch-press condition for respectively touch buttons 305B and 305A. In both cases, back-side mounting of the touch sensors 310A/310B to the sidewall 301, at the back-side of respective touch buttons 305A/305B, to provide the defined sensing gap $D_{SG}$. A touch-press of the touch button 305B/305A results in a local deflection $D_L$ that is less than the defined sensing gap $D_{SG}$ by a pre-defined threshold, and that is distinguished from the non-localized deflection of both touch buttons (FIG. 2, $D_{SW}$).

Referring back to FIG. 1A, a design consideration is the distance $D_E$ between the dual touch buttons 105A/105B and a supporting edge wall 102 of the device case. The separation DE will affect sensitivity, as will the size of the touch button area, including the length of the touch sensor 110A110B (as discussed in connection with FIG. 4B).

Figure 1B:
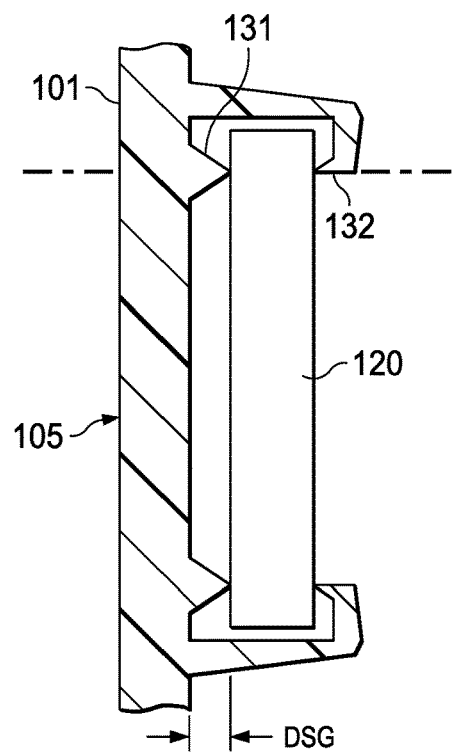
Figure 1C:
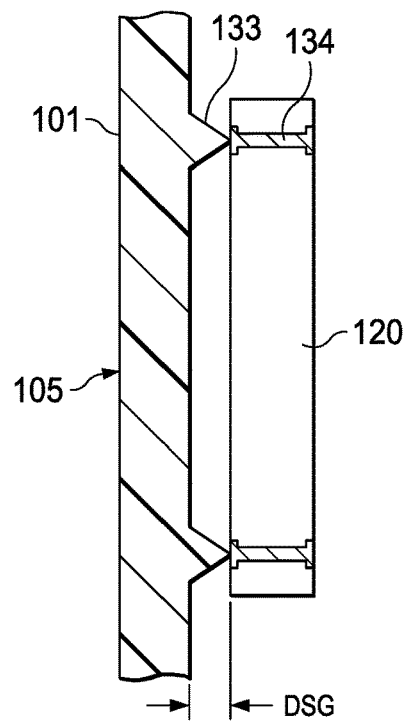

Referring to FIGS. 1A-1C, alternate example back-side mounting structures include: FIG. 1A, spacer elements 130A/130B; FIG. 1B, a snap-in structure 131/132; and FIG. 1C copper vias 133/134 (such as by electric spot welding. In addition, alternate example back-side mounting structures are described in connection with touch sensor implementations described in connection with FIGS. 5A-5B and FIGS. 6A-6C, which both use an example flex PCB (printed circuit board) with dual sensor sections as described in connection with FIG. 7.

FIGS. 4A-4B illustrate an example touch sensing system 400 including a spaced $D_S$ touch sensor assembly 410 for a touch button 405. Touch sensor assembly 410 includes a sense inductor coil 440. Sense inductor coil 440 is coupled 415 to sensor electronics implemented as an inductance-to-data converter (IDC) 450.

Referring also to FIG. 1A, in an example multi-channel implementation, IDC 450 drives respective sense coils for dual touch sensors 110A/110B to project respective time-varying magnetic sensing fields into respective sensing areas on the back-side the touch button 405 (105A/105B). IDC 450 measures local deflection of the touch button 105A/105B in response to a touch-press of the touch button 105A/105B based on a reduction in the proximity of the sidewall 101 to the sense coil 440/140AB, as representing a local deflection $D_L$ in relation to the defined sensing gap $D_{SG}$ (i.e., a local touch-press deflection $D_L$ less than the defined sensing gap $D_{SG}$ by a defined threshold). Based on detection/measurement of a local deflection $D_L$, IDC 450 signals a button-press condition. As illustrated in FIG. 4B, the converted touch-press data is a non-linear function of distance deflection distance $D_L$.

FIGS. 5A-5B illustrate an example dual touch sensor assembly 510, including touch sensors 510A/510B. Touch sensor assembly 510 includes a flex PCB 541 (such as a multi-layer flexible PCB). Flex PCB 541 includes dual separate sense coil PCB sections 541A/541B, with a center trace connector 545.

Referring to FIG. 5B, each touch sensor assembly FIG. 5B includes a flex sense coil PCB 541 mounted to a stiffener 520, with spacer elements 530 adhered to an adhesive laminate 560. Adhesive laminate 560 includes a copper layer/laminate 561 spaced from the sense coil PCB sections 541 a defined sensing gag $D_S$ determined by the geometry of the spacer elements 530.

Referring also to FIG. 1A, epoxy laminate is adhered to a sidewall 101 at the touch button area 105 (105A/105B). Local deflection of the touch button (sidewall) 105A/105B deflects the conductive copper layer/laminate 561 toward the sense coil PCB section 541.

Stiffener 520 can be, for example, an epoxy laminate such as FR-4. Spacer elements 530 can be, for example, FR-4 or a polyimide material. Adhesive laminate can be FR-4 epoxy laminate.

Figure 6A:
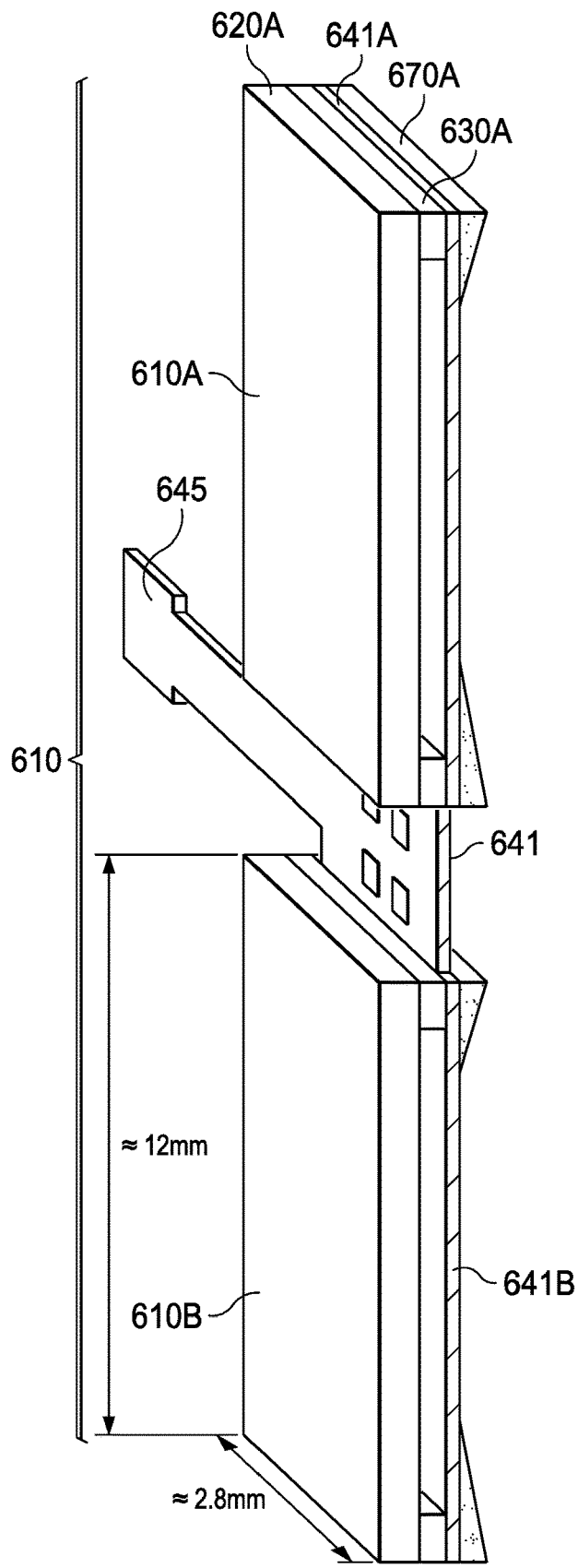
FIGS. 6A-6C illustrate an alternate example dual touch sensor assembly [610, 610A/610B], with a flex PCB [641] including separate sense coil PCB sections [641A/641B] with a center trace connector [645], each touch sensor assembly FIG. 6B including a stiffener [620] with a copper laminate [621], and with spacer elements [630] adhered to a flex sense coil PCB [641] mounted to pressure sensitive adhesive, the sense coil PCB spaced from the copper laminate [661] by a defined sensing gag [$D_S$].
Figure 6B:
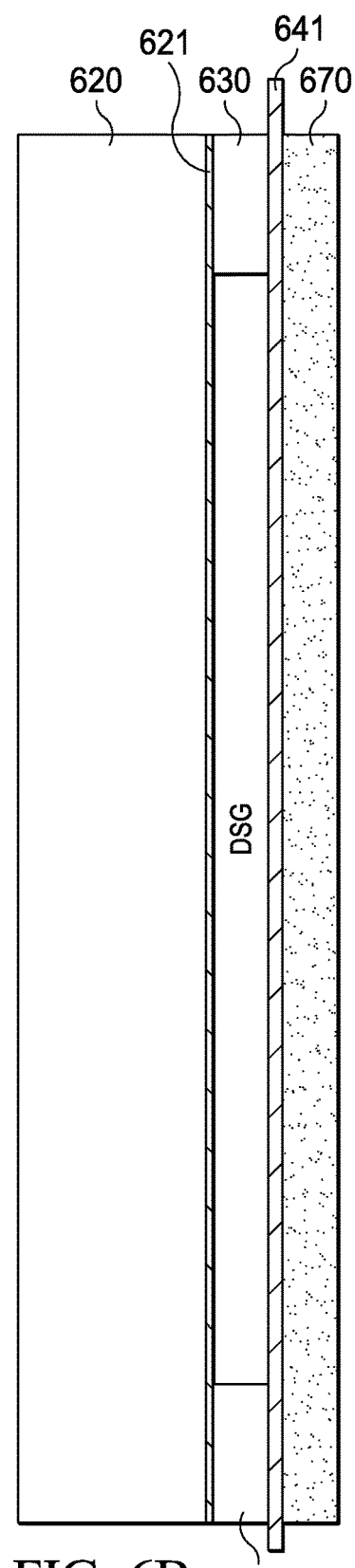
Figure 6C:
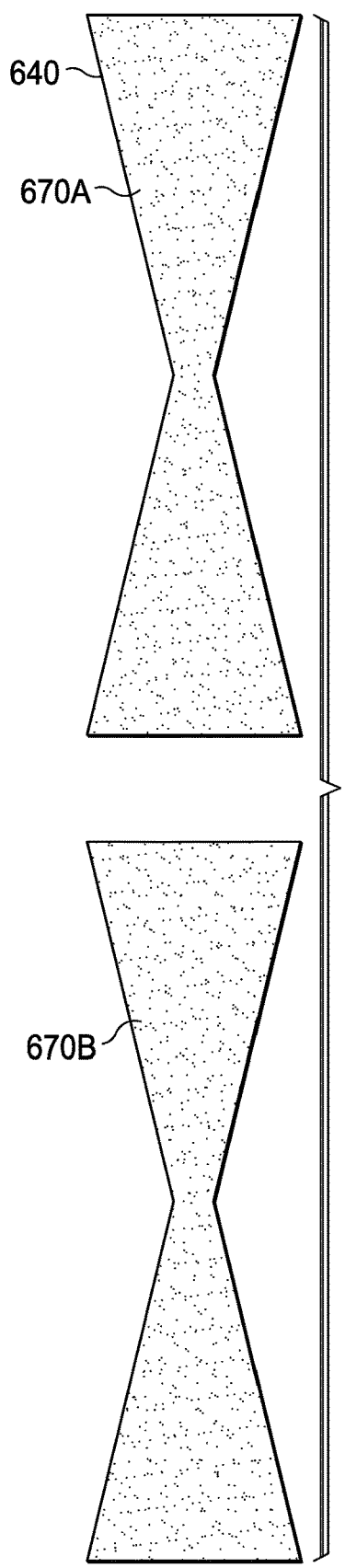

FIGS. 6A-6C illustrate an alternate example dual touch sensor assembly 610, including touch sensors 610A/610B. Touch sensor assembly 610 includes a flex PCB 641 (such as a multi-layer flexible PCB). Flex PCB 641 includes separate sense coil PCB sections 641A/641B, with a center trace connector 645.

Referring to FIG. 6B-6C, each touch sensor assembly includes a stiffener 620, with a copper laminate/layer 621. The flex PCB 641 is adhered to a pressure sensitive adhesive, and spaced from the conductive copper laminate layer 621 on stiffener 620 by spacer elements 630 by a defined sensing gag $D_S$, determined by the geometry of the spacer elements 630. An example configuration for the pressure sensitive adhesive is illustrated in FIG. 6C.

Referring also to FIG. 1A, pressure sensitive adhesive is adhered to a sidewall 101 at the touch button area 105 (105A/105B). Local deflection of the touch button (sidewall) deflects the sense coil PCB section 641 toward the conductive copper layer/laminate 621.

Stiffener 620 can be, for example, an epoxy laminate such as FR-4. Spacer elements 630 can be, for example, FR-4 or a polyimide material.

Figure 7:
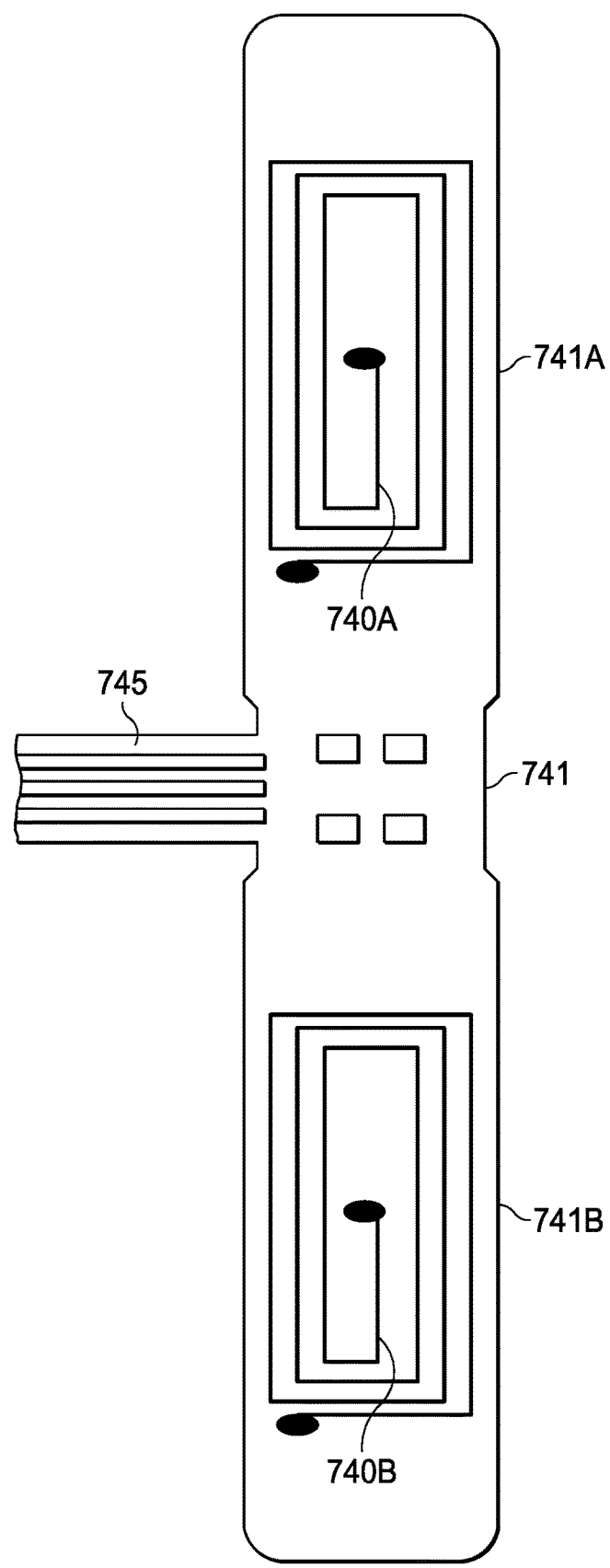
FIG. 7 illustrates an example flex PCB [741] with dual sense coil PCB sections [741A/741B] with sense inductor coils [740A/740B] trace coupled to a center trace connector [745].

FIG. 7 illustrates an example flex PCB 741, with dual sense coil PCB sections 741A/741B. The PCB sense coil sections include respective sense inductor sense coil traces 740A/740B. The sense coils 740A/740B are trace coupled to a center trace connector 745.

The Disclosure provided by this Description and the Figures sets forth example embodiments and applications illustrating aspects and features of the invention, and does not limit the scope of the invention, which is defined by the claims. Known circuits, connections, functions and operations are not described in detail to avoid obscuring the principles and features of the invention. These example embodiments and applications, including example design considerations and tradeoffs, can be used by ordinarily skilled artisans as a basis for modifications, substitutions and alternatives to construct other embodiments, including adaptations for other applications.

The invention claimed is:

1. An apparatus for use in a system with at least adjacent first and second touch input areas defined on a front-side of a touch surface, comprising:
   first and second touch sensor assemblies, each including
      a support structure, and
      a mounting structure to mount the support structure to a back-side of the touch surface, opposite a respective touch input area; and
   the first touch sensor assembly mounted at a first back-side area of the back-side of the touch surface opposite the first touch input area, with the associated support structure spaced from the first back-side area by a defined sensing gap; and
   the second touch sensor assembly mounted at a second back-side area of the back-side of the touch surface opposite the second touch input area, with the associated support structure spaced from the second back-side area by a defined sensing gap;
   for each touch sensor assembly, a sense inductor coil disposed on one of:
      the associated support structure, opposite a respective back-side area of the touch surface, opposite a respective touch input area, with the sense inductor coil spaced from the first back-side area by the defined sensing gap, or
      the respective back-side area of the touch surface, opposite the respective touch input area, with the associated sense inductor coil spaced from the associated support structure by the defined sensing gap.

2. The apparatus of claim 1, wherein, for each touch sensor assembly:
   the associated sense inductor coil is disposed on the associated support structure, opposite a respective back-side area of the touch surface, opposite a respective touch input area, and deflection of the respective touch input area causes the touch surface to deflect toward the respective sense inductor coil with a localized deflection independent of a non-localized deflection of the surface including both touch input areas.

3. The apparatus of claim 1, wherein, for each touch sensor assembly:
the sense inductor coil is disposed on the associated back-side area of the touch, opposite a respective touch input area, and
deflection of the respective touch input area causes a localized deflection of the touch surface and the sense coil inductor toward the associated support structure.

4. The apparatus of claim 1, wherein each sense inductor coil is disposed on a flexible printed circuit board.

5. The apparatus of claim 4, wherein each sense inductor coil is disposed on a dual flexible printed circuit board with separate sense coil mounting sections, a center trace connector.

6. The apparatus of claim 1, wherein the touch surface is a device wall of a device with devices walls defining an interior or the device, and with the touch sensor assemblies mounted in the interior or the device.

7. The apparatus of claim 2, wherein each sense inductor coil is coupled to a sensor electronics unit operable to drive the sense inductor coils, measure resulting inductor sense coil signals based on a localized deflection, and generate corresponding touch-press data.

8. A device including a device case with a device wall with at least adjacent first and second touch input areas defined on an exterior-side of the device wall, comprising:
first and second touch sensor assemblies, each including
a support structure, and
a mounting structure to mount the support structure to an interior-side of the device wall, opposite a respective touch input area; and
the first touch sensor assembly mounted at a first interior-side area of the interior-side of the device wall opposite the first touch input area, with the associated support structure spaced from the first interior-side area by a defined sensing gap; and
the second touch sensor assembly mounted at a second interior-side area of the interior-side of the device wall opposite the second touch input area, with the associated support structure spaced from the second interior-side area by a defined sensing gap;
for each touch sensor assembly, a sense inductor coil disposed on one of:
the associated support structure, opposite a respective interior-side area of the device wall, opposite a respective touch input area, with the sense inductor coil spaced from the first interior-side area by the defined sensing gap, or
the respective interior-side area of the device wall, opposite the respective touch input area, with the associated sense inductor coil spaced from the associated support structure by the defined sensing gap.

9. The device of claim 8, wherein, for each touch sensor assembly:
the associated sense inductor coil is disposed on the associated support structure, opposite a respective interior-side area of the touch surface, opposite a respective touch input area, and
deflection of the respective touch input area causes the touch surface to deflect toward the respective sense inductor coil with a localized deflection independent of a non-localized deflection of the surface including both touch input areas.

10. The device of claim 8, wherein, for each touch sensor assembly:
the sense inductor coil is disposed on the associated interior-side area of the touch, opposite a respective touch input area, and
deflection of the respective touch input area causes a localized deflection of the touch surface and the sense coil inductor toward the associated support structure.

11. The device of claim 8, wherein each sense inductor coil is disposed on a flexible printed circuit board.

12. The device of claim 11, wherein each sense inductor coil is disposed on a dual flexible printed circuit board with separate sense coil mounting sections, a center trace connector.

13. The apparatus of claim 9, wherein each sense inductor coil is coupled to a sensor electronics unit operable to drive the sense inductor coils, measure resulting inductor sense coil signals based on a localized deflection, and generate corresponding touch-press data.

14. A method of touch sensing for use in device including a device wall with at least adjacent first and second touch input areas defined on an exterior-side of the device wall, comprising:
configuring first and second touch sensor assemblies, each including a support structure, and a mounting structure to mount the support structure to an interior-side of the device wall, opposite a respective touch input area; and
mounting the first touch sensor assembly at a first interior-side area of the interior-side of the device wall opposite the first touch input area, with the associated support structure spaced from the first interior-side area by a defined sensing gap; and
mounting the second touch sensor assembly at a second interior-side area of the interior-side of the device wall opposite the second touch input area, with the associated support structure spaced from the second interior-side area by a defined sensing gap;
for each touch sensor assembly, disposing a sense inductor coil on one of:
the associated support structure, opposite a respective interior-side area of the device wall, opposite a respective touch input area, with the sense inductor coil spaced from the first interior-side area by the defined sensing gap, or
the respective interior-side area of the device wall, opposite the respective touch input area, with the associated sense inductor coil spaced from the associated support structure by the defined sensing gap.

15. The method of claim 14, wherein, for each touch sensor assembly:
disposing the associated sense inductor coil on the associated support structure, opposite a respective interior-side area of the touch surface, opposite a respective touch input area, such that
deflection of the respective touch input area causes the touch surface to deflect toward the respective sense inductor coil with a localized deflection independent of a non-localized deflection of the surface including both touch input areas.

16. The method of claim 14, wherein, for each touch sensor assembly:
disposing the sense inductor coil on the associated interior-side area of the touch, opposite a respective touch input area, such that deflection of the respective touch input area causes a localized deflection of the touch surface and the sense coil inductor toward the associated support structure.

17. The method of claim 14, further comprising disposing each sense inductor coil on a flexible printed circuit board.

18. The method of claim 17, wherein each sense inductor coil is disposed on a dual flexible printed circuit board with separate sense coil mounting sections, a center trace connector.

19. The method of claim 15, further comprising coupling each sense inductor coil to a sensor electronics unit operable to drive the sense inductor coils, measure resulting inductor sense coil signals based on a localized deflection, and generate corresponding touch-press data.

* * * * *